(12) United States Patent
Frink et al.

(10) Patent No.: US 10,770,911 B1
(45) Date of Patent: Sep. 8, 2020

(54) CALIBRATING BATTERY FUEL GAGES

(71) Applicant: Amazon Technologies, Inc., Seattle, WA (US)

(72) Inventors: Darin Lee Frink, Lake Tapps, WA (US); Ligong Wang, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 291 days.

(21) Appl. No.: 15/810,582

(22) Filed: Nov. 13, 2017

(51) Int. Cl.
*H02J 7/00* (2006.01)
*G01R 35/00* (2006.01)
*G01R 31/387* (2019.01)

(52) U.S. Cl.
CPC .......... *H02J 7/0047* (2013.01); *G01R 31/387* (2019.01); *G01R 35/005* (2013.01); *H02J 7/0048* (2020.01)

(58) Field of Classification Search
None
See application file for complete search history.

(56) References Cited

U.S. PATENT DOCUMENTS

| | | | |
|---|---|---|---|
| 5,592,094 A | 1/1997 | Ichikawa | |
| 5,616,968 A | 4/1997 | Kiso et al. | |
| 2008/0164762 A1 | 7/2008 | Pecile | |
| 2009/0218989 A1* | 9/2009 | Davis | H01M 10/4207 320/136 |
| 2014/0239964 A1 | 8/2014 | Gach et al. | |
| 2015/0067362 A1 | 3/2015 | Sultenfuss et al. | |
| 2015/0377971 A1 | 12/2015 | Keating et al. | |
| 2016/0028254 A1 | 1/2016 | Honoki et al. | |
| 2016/0266979 A1* | 9/2016 | Glover | G06F 9/30083 |
| 2016/0372935 A1* | 12/2016 | Sakata | G01R 31/36 |
| 2017/0057650 A1 | 3/2017 | Walter-robinson | |

OTHER PUBLICATIONS

U.S. Appl. No. 15/806,204, filed Nov. 7, 2017, Titled: Determining Battery Capacity.

* cited by examiner

*Primary Examiner* — Nasima Monsur
(74) *Attorney, Agent, or Firm* — Kilpatrick Townsend & Stockton LLP

(57) ABSTRACT

Calibrating a battery capacity gage employs a controlled discharge of a backup battery unit. A method of updating a capacity gage includes charging a backup battery unit to a predetermined high charge level. A first amount of energy is discharged from the backup battery unit at a first controlled discharge rate so as to discharge the backup battery unit from the predetermined high charge level to a first low charge level. The backup battery unit is charged back to the predetermined high charge level. A power system controller estimates, based on the first amount of energy and the first controlled discharge rate, a second amount of energy that can be discharged from the backup battery unit at a second controlled discharge rate greater than the first controlled discharge rate. The capacity gage is updated based on the second amount of energy estimated by the power system controller.

19 Claims, 6 Drawing Sheets

CALIBRATING BATTERY FUEL GAGES

BACKGROUND

Many critical electrically powered systems include one or more backup battery units that provide backup power to the system in the event of a loss of utility power. Backup battery units, however, can degrade over time to a point of not being capable of providing adequate backup power to the system in the event of loss of utility power.

BRIEF DESCRIPTION OF THE DRAWINGS

Various embodiments in accordance with the present disclosure will be described with reference to the drawings, in which.

DETAILED DESCRIPTION

Figure 1:
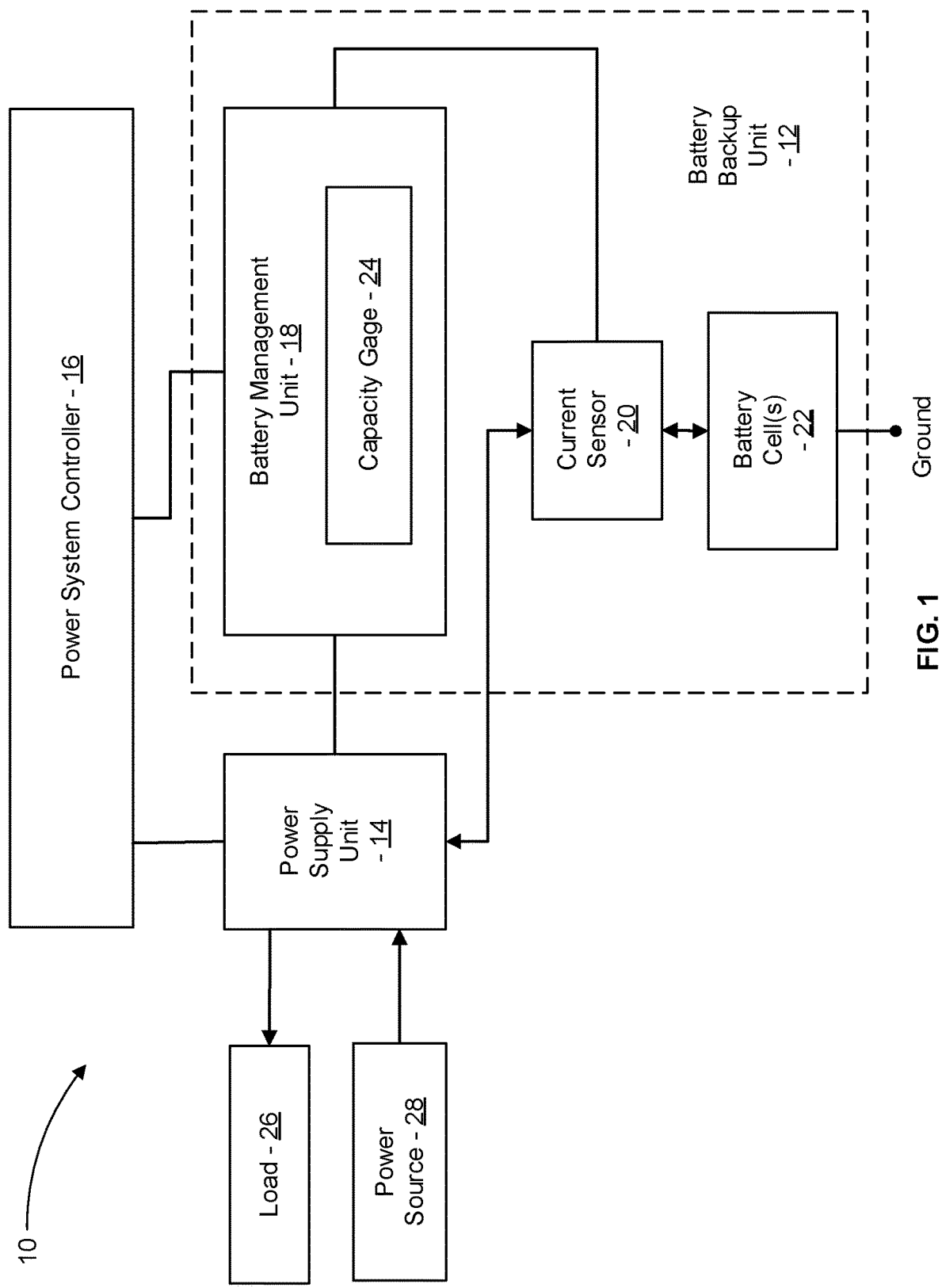
FIG. 1 is a simplified schematic diagram of a power supply system including a power system controller and a backup battery unit that includes a battery management unit with a capacity gage, in accordance with some embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Systems and methods described herein update a capacity gage of a battery management unit by measuring the amount of energy discharged from a backup battery unit at a controlled discharge rate (e.g., constant current, constant power) that is lower than a design discharge rate for the backup battery unit. In some embodiments, a power supply unit is controlled to discharge the backup battery unit at the lower controlled discharge rate. In some embodiments, the power supply unit is controlled to output a varying electric power (e.g., a varying direct current (DC) power) as drawn by a load and generate the varying electric power from a combination of the amount of energy discharged from the backup battery unit at the lower controlled discharge rate and a varying electric power supplied to the power supply unit. In some embodiments, a power system controller estimates the capacity of the backup battery unit at the design discharge rate based on the amount of energy discharged at the lower controlled discharge rate and the lower controlled discharge rate. For example, in some embodiments, a backup battery unit includes a battery management unit that includes a capacity gage indicating the amount of energy that can be discharged by the backup battery unit at the design discharge rate from a predetermined high state of charge (e.g., a full state of charge for the backup battery unit) to a lower state of charge (e.g., an empty state of charge for the backup battery unit). In many embodiments, the design discharge rate is suitable relative to typical power levels drawn by a corresponding load so as to ensure adequate capacity of the backup battery unit to supply foreseeable power requirements of the load. By discharging the backup battery unit at the lower controlled discharge rate, which in many embodiments is below a minimum power level drawn by the load, the energy discharged by the backup battery unit can be supplied to the load instead of generating heat in a resistor unit. By supplying the power discharged by the backup battery unit to a regular load, the backup battery unit need not include a resistor unit to consume the discharged power and need not include a cooling system to dissipate heat generated by the resistor unit. Moreover, by discharging the backup battery unit at the lower controlled discharge rate, the energy discharged by the backup battery unit can be accurately measured without using a high sample-rate measurement approach that may be required to accurately measure the energy discharged by the battery using an uncontrolled and highly varying discharge rate.

Turning now to the drawings in which like reference indicators refer to like elements in the various figures, FIG. 1 is a simplified schematic diagram of a power supply system 10, in accordance with some embodiments. The power supply system 10 includes a backup battery unit 12, a power supply unit 14, and a power system controller 16. The backup battery unit 12 includes a battery management unit 18, a current sensor 20, and one or more battery cells 22. The battery management unit 18 includes a capacity gage 24 that stores an estimate of the amount of energy that can be discharged from the battery cell(s) 22 from the current state of charge of the battery cell(s) 22 to a lower state of charge (e.g., a state of charge below which the battery management unit 18 blocks further discharge of the battery cell(s) 22 to prevent an undesirable under-voltage condition). The capacity gage 24 can have any suitable configuration. For example, the battery management unit 18 can include one or more processors and a memory device that stores capacity data indicating the estimate of the amount of energy that can be discharged from the battery cell(s) 22 from the current state of charge of the battery cell(s) 22 to the lower state of charge.

In many embodiments, the power supply unit 14 is operable to supply electrical power (e.g., direct current (DC) power, alternating current (AC) power) to a load 26 at a rate (e.g., variable, constant) drawn by the load 26. The power supply unit 14 is operable to generate the electrical power supplied to the load 26 from electrical power (e.g., DC power, AC power) supplied to the power supply unit 14 by a power source 28. In the event that the power source 28 is incapable of supplying adequate electrical power to the power supply unit 14 to satisfy the power requirements of the load 26 (e.g., when the power source 28 is a utility power source that is experiencing a temporary outage), the power supply unit 14 is operable to draw DC power from the backup battery unit 12 and generate the electrical power supplied to the load 26 from the DC power drawn from the backup battery unit 12.

In many embodiments, the power supply unit 14 is operable to supply DC power to the backup battery unit 12 to charge the battery cell(s) 22. For example, in many embodiments, when the power source 28 is capable of supplying adequate electrical power to the power supply unit 14, the power supply unit 14 can simultaneously supply electrical power to the load 26 and DC power to the backup battery unit 12 to charge the battery cell(s) 22 to a predetermined high charge level (e.g., a full charge level for the backup battery unit 12).

In many embodiments, the capacity gage 24 is continually updated based on the amount of current flowing into and out of battery cell(s) 22 as sensed by the current sensor 20 and a voltage level of the battery cells(s) 22. For example, during discharge of energy from the battery cell(s) 22 to the power supply unit (14), the current flowing from the battery cell(s) is sensed by the current sensor 20, which transmits a signal to the battery management unit 18 indicative of the magnitude of the current flowing from the battery cell(s) 22. The battery management unit 18 processes the signal from the current sensor 20 in combination with a voltage of the battery cell(s) 22 and elapsed time to measure energy discharged from the battery cell(s) 22. The battery management unit 18 repeatedly updates the capacity gage 24 to reflect the amount of energy discharged from the battery cell(s) 22. During charging of the battery cells(s) 22, the battery management unit 18 processes the signal from the current sensor 20 in combination with a voltage of the battery cell(s) 22 and elapsed time to measure the energy charged into the battery cell(s) 22. The battery management unit 18 repeatedly updates the capacity gage 24 to reflect the amount of energy charged into the battery cell(s) 22.

In many embodiments, the power system controller 16 is configured to control operation of the power supply unit 14 so as to calibrate the capacity gage 24. Over time, the capacity gage 24 can become inaccurate with respect to the actual amount of energy that can be discharged by the battery cell(s) 22 at the design discharge rate. For example, over time, energy can be slowly discharged from the battery cell(s) 22 via one or more leakage currents that are not measured by the current sensor 20. Because the leakage current(s) is not measured by the current sensor 20, the capacity gage 24 is not updated to reflect the energy discharged from the battery cell(s) 22 by the leakage current(s). As a result, over time, the capacity gage 24 can increasingly overestimate the amount of energy available to be discharged from the battery cell(s) 22. In many embodiments, the power system controller 16 controls operation of the power supply unit 14 to conduct a capacity gage calibrating discharge/charge cycle of the backup battery unit 12 to calibrate the capacity gage 24 as described herein.

Figure 2:
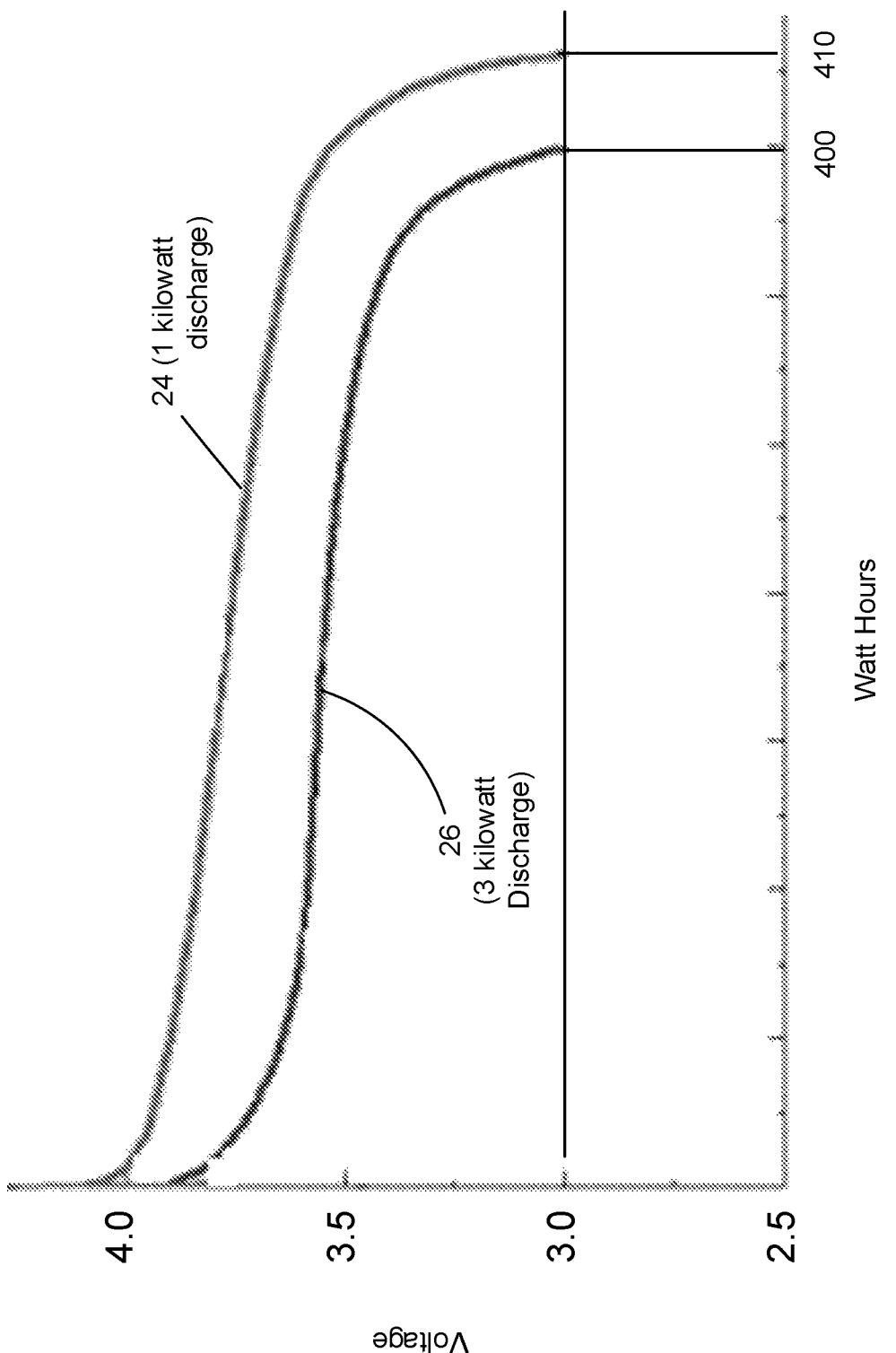
FIG. 2 is a graph illustrating discharge capacities of a backup battery unit at two different discharge rates, in accordance with some embodiments.

In many embodiments, the power system controller 16, during the capacity gage calibrating discharge/charge cycle of the backup battery unit 12, controls operation of the power supply unit 14 to discharge the battery cell(s) 22 at a controlled discharge rate that is lower than a design discharge rate for the backup battery unit 12. For example, FIG. 2 is a graph illustrating discharge capacities of the backup battery unit 12 at two different discharge rates, in accordance with some embodiments. In FIG. 2, discharge curve 24 corresponds to a discharge of the backup battery unit 12 from 4.2 Volts down to 3.0 Volts at a constant discharge power of 1.0 kilowatts.

The amount of energy discharged by the backup battery unit 12 during the discharge corresponding to discharge curve 24 is 410 watt-hours. Discharge curve 26 corresponds to a discharge of the backup battery unit 12 from 4.2 Volts down to 3.0 volts at a design discharge power of 3.0 kilowatts. The amount of energy discharged by the backup battery unit 12 during the discharge corresponding to discharge curve 26 is 400 watt-hours. In many embodiments, the battery management unit 18 terminates discharge of energy from the battery cell(s) 22 when the output voltage of the backup battery unit 12 drops to a predetermined low voltage level (e.g., 3.0 volts in the embodiment illustrated in FIG. 2) so as to avoid an undesirable under-voltage condition. In such embodiments, more energy can be discharged at a lower discharge rate (e.g., 1.0 kilowatt) than at a higher design discharge rate (e.g., 3.0 kilowatt) due to the backup battery unit 12 having a lower internal voltage drop at the lower discharge rate than for the higher design discharge rate, thereby enabling more energy to be discharged at the lower discharge rate before the resulting output voltage of the backup battery unit 12 falls to the predetermined low voltage level.

In many embodiments, the power system controller 16 estimates the energy capacity of the backup battery unit 12 for a design discharge rate (e.g., 3.0 kilowatt) by multiplying the amount of energy discharged at the lower controlled discharge by a suitable factor. For example, for the embodiment illustrated in FIG. 2, the energy capacity of the backup battery unit 12 for a discharge rate of 3.0 kilowatt can be estimated by the power system controller 16 by multiplying the amount of energy discharged at the discharge rate of 1.0 kilowatt by a factor equal to the discharged energy for discharge curve 26 divided by the discharged energy for discharge curve 24 (400/410).

In many embodiments, the power system controller 16 includes a memory device storing data used to estimate the energy capacity of the backup battery unit 12 at a design discharge rate for any suitable number of lower controlled discharge rates and any suitable number of amounts of energy discharged at the respective lower controlled discharge rate. The data stored can be generated by measuring the amounts of energy that can be discharged by any suitable number of instances of the backup battery unit 12 covering a suitable range of energy capacities at the design discharge rate. For example, a suitable number of the backup battery unit 12 can be monitored over the operational life span of the respective backup battery unit 12 to repeatedly measure both the energy capacity of the respective backup battery unit 12 at the lower controlled discharge rate and the design discharge rate for a suitable range of the energy capacity of the backup battery unit 12 at the design discharge rate. An example suitable range can extend from a maximum observed energy capacity at the design discharge rate for a new instance of the backup battery unit 12 down to a minimum observed energy capacity at the design discharge rate for an instance of the backup battery unit 12 at the end of its useable life.

Figure 3:
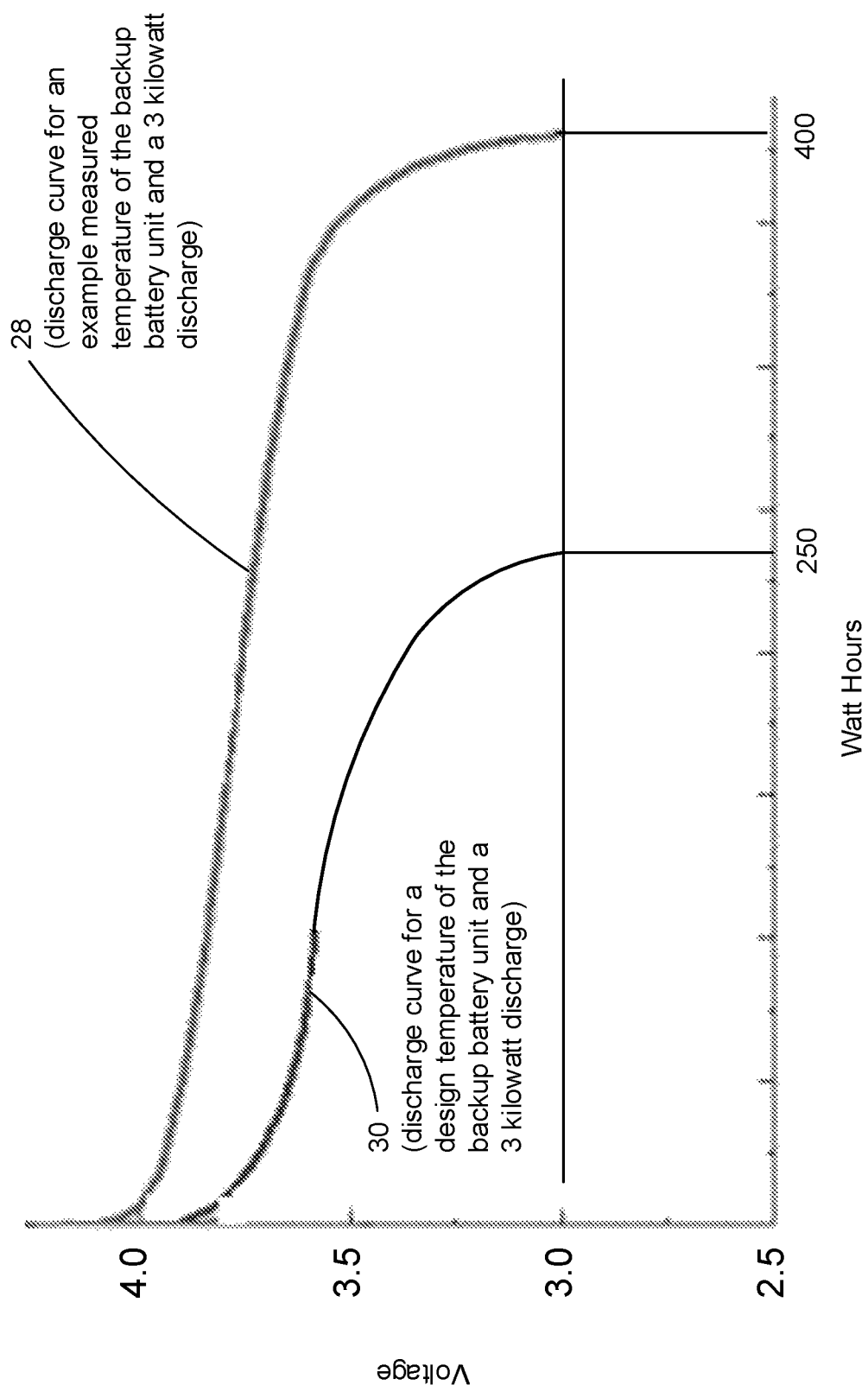
FIG. 3 is a graph illustrating discharge capacities of a backup battery unit at two different temperatures, in accordance with some embodiments.

The power system controller 16 can be configured to estimate the amount of energy that can be discharged from the backup battery unit 12 at the design discharge rate further based on any suitable additional factor (e.g., a temperature of the backup battery unit 12, age of the backup battery unit 12, discharge cycle count of the backup battery unit 12). The power system controller 16 can store correction factor data by which the estimated amount of energy that can be discharged from the backup battery unit 12 at the design discharge rate corrected to reflect the additional factor. For example, FIG. 3 is a graph illustrating discharge capacities of an instance of the backup battery unit 12 at two different temperatures, in accordance with some embodiments. In FIG. 3, discharge curve 28 corresponds to a discharge of the instance of the backup battery unit 12 from 4.2 Volts down to 3.0 Volts at an example design temperature of 25 degrees Celsius under discharge power of 3.0 kilowatts. The amount of energy discharged by the instance of the backup battery unit 12 during the discharge corresponding to discharge curve 28 is 400 watt-hours. Discharge curve 30 corresponds to a discharge of the instance of the backup battery unit 12 from 4.2 Volts down to 3.0 volts at a lower temperature of 5 degrees Celsius under discharge power of 3.0 kilowatts. The amount of energy discharged by the instance of the backup battery unit 12 during the discharge corresponding to discharge curve 30 is 250 watt-hours. Accordingly, power system controller 16 can estimate of the amount of energy that can be discharged by the instance of the backup battery unit 12 at the design temperature and the design discharge rate by multiplying the estimate of the amount of energy that can be discharged by the instance of the backup battery unit 12 at the lower temperature by a suitable factor (e.g., the discharged energy for discharge curve 28 divided by the discharged energy for discharge curve 30 (400/250)). Similar approaches can be used to adjust the estimate of the amount of energy that can be discharged at the design discharge rate for any other suitable parameter, such as for the age of the backup battery unit 12 and/or the discharge cycle count for the backup battery unit 12. In many embodiments, the power system controller stores suitable data that is used to adjust the estimate of the energy that can be discharged at the design discharge rate for each of the additional parameters (e.g., a temperature of the backup battery unit 12, age of the backup battery unit 12, cycle count of the backup battery unit 12, and system actual load power).

In many embodiments, the power system controller 16 communicates the resulting estimate of the capacity of the backup battery unit 12 at the design discharge rate (and optionally also at the design discharge temperature) to the battery management unit 18 and the capacity gage 24 is updated based on the estimate of the capacity of the backup battery unit 12 at the design discharge rate. For example, in many embodiments, the capacity gage 24 is updated at a suitable time following recharging of the backup battery unit 12 to the predetermined high charge level (e.g., full charge level) to reflect the estimated capacity of the backup battery unit that can be discharged at the design discharge level so as to avoid having to account for the possibility of the backup battery unit 12 being at a charge level different from the predetermined high charge level.

Figure 4:
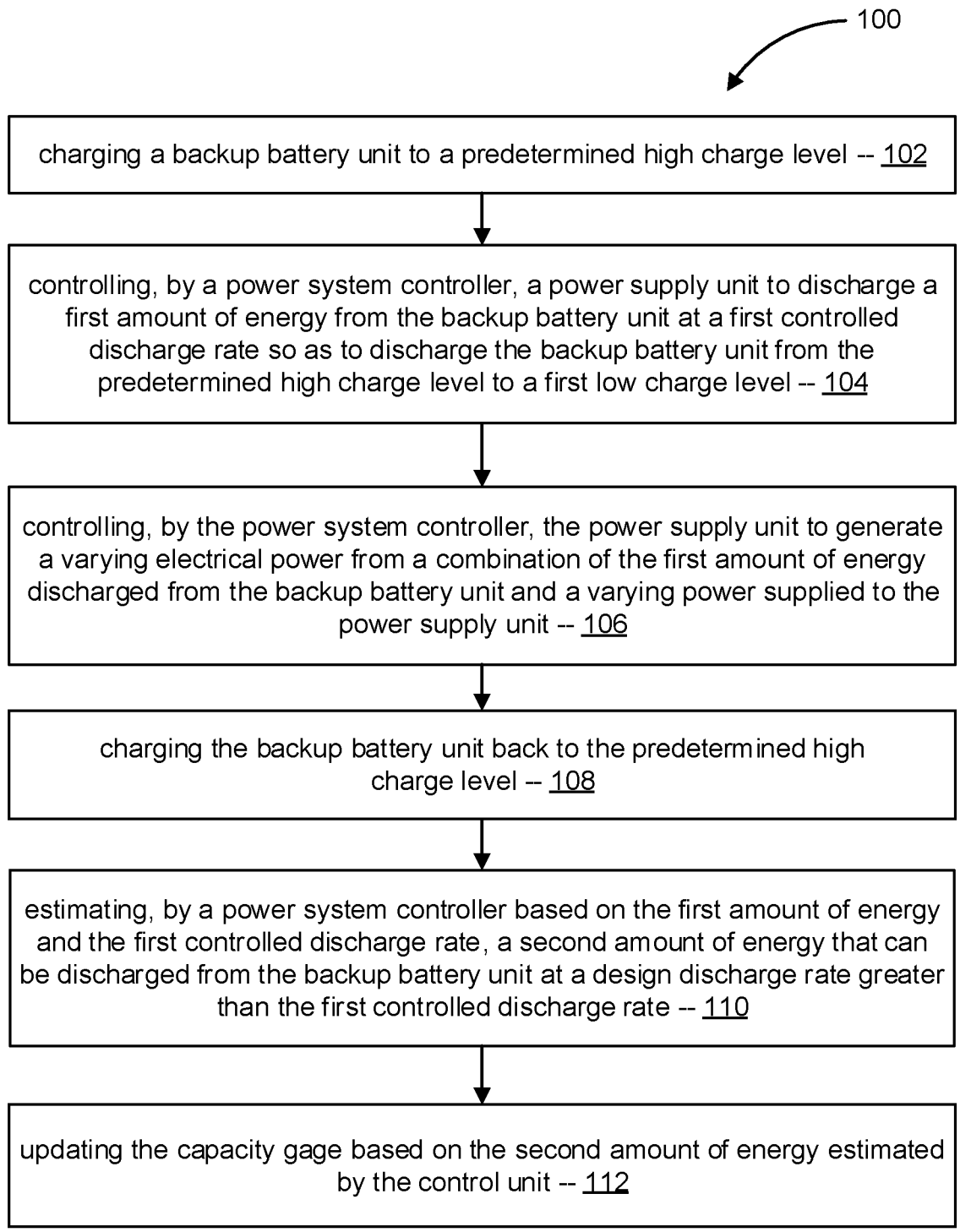
FIG. 4 is a simplified schematic diagram of acts of a method of calibrating a capacity gage of a backup battery unit, in accordance with some embodiments.

FIG. 4 is a simplified schematic diagram of acts of a method 100 of calibrating a capacity gage (e.g., the capacity gage 24) in a battery management unit (e.g., the battery management unit 18) of a backup battery unit (e.g., the backup battery unit 12), in accordance with some embodiments. In many embodiments, the capacity gage indicates an estimate of the amount of energy stored within the backup battery unit that can be discharged at a design discharge rate (e.g., a design constant current, a design constant power) from the backup battery unit to discharge the backup battery unit from a predetermined high charge level (e.g., a full charge level) to a predetermined low charge level (e.g., an empty charge level for the design discharge rate). Some or all of the method 100 (or any other methods described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors.

The computer-readable storage medium may be non-transitory.

The method 100 includes charging the backup battery unit to the predetermined high charge level (e.g., full charge level) (act 102). By charging the backup battery unit to the predetermined high charge level, the capacity gage 24 can be updated when the backup battery unit has the predetermined high charge level, thereby avoiding having to correct the capacity gage 24 to reflect a charge level of the backup battery unit other than the predetermined high charge level.

In act 104, a power supply unit (e.g., the power supply unit 14) is controlled by a power system controller (e.g., the power system controller 16) to discharge a first amount of energy from the backup battery unit at a first controlled discharge rate (e.g., a constant current, a constant power) so as to discharge the backup battery unit from the predetermined high charge level to a predetermined low charge level for the first controlled discharge rate. In many embodiments, the battery management unit terminates discharge of energy from the backup battery unit in response to an output voltage of the backup battery unit dropping to a suitable predetermined minimum output voltage to avoid an undesirable under-voltage condition of the backup battery unit. In many embodiments, the first controlled discharge rate is lower than the design discharge rate. The first amount of energy discharged by the backup battery unit can be determined using any suitable approach (e.g., by measuring the current flowing from the backup battery unit and the output voltage of the backup battery unit and integrating over time to determine the first amount of energy discharged by the backup battery unit).

In optional act 106, the power supply unit can be controlled by the power system controller to supply a varying electrical power to a load and generate the varying electrical power from a combination of the first amount of energy discharged from the backup battery unit at the first controlled discharge rate and a varying electric power supplied to the power supply unit. In many embodiments, the first controlled discharge rate is selected to be less than an expected minimum power drawn by the load from the power supply unit so as to ensure the ability to discharge the backup battery unit at the first controlled discharge rate throughout the discharge of the backup battery unit from the predetermined high charge level to the low charge level for the first controlled discharge rate. In some embodiments, the first controlled discharge rate is less than 50% of the design discharge rate.

Figure 5:
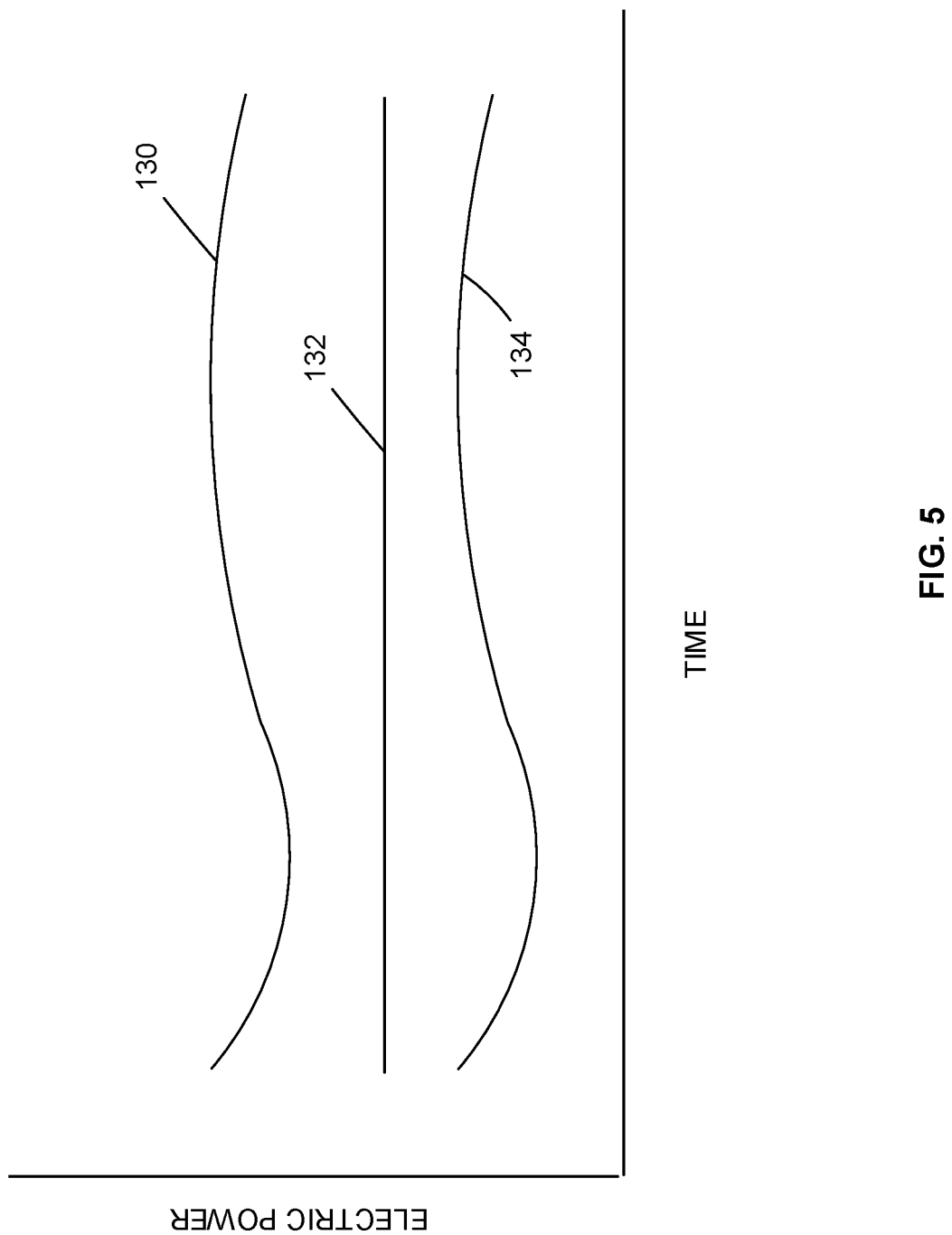
FIG. 5 is a graph illustrating supplying a varying electric power to a load and generating the varying electric power via a combination of a controlled discharge rate from a backup battery unit and a varying electric power from a power source, in accordance with some embodiments.

For example, FIG. 5 is a graph illustrating a varying electric power 130 supplied to a load by the power supply unit. The varying electrical power 130 is generated by the power supply unit from a combination of a controlled electrical power 132 discharged by the backup battery unit at the first controlled discharge rate and a varying electric power 134 supplied to the power supply unit. For example, in the power supply system 10, the power system controller 16 can control operation of the power supply unit 14 to generate the varying electric power 130 so as to meet power demands of the load 26 from a combination of the controlled electrical power 132 discharged by the battery cell(s) 22 at the first controlled discharge rate and the varying electric power 134 supplied to the power supply unit 14 by the power source 28. Accordingly, the battery cell(s) 22 can be discharged at the first controlled discharge rate and the discharged power used to generate the varying electric power 130 supplied to the load, thereby avoiding having to waste the electric power 132 discharged by the battery cell(s) 22.

In act 108, the backup battery unit is charged back to the predetermined high charge level. By charging the backup battery unit back to the predetermined high charge level, the capacity gage can be more accurately updated relative to the predetermined high charge level.

In act 110, the power system controller estimates the amount of energy that can be discharged at the design discharge rate based on the amount of energy discharged at the first controlled discharge rate and the first controlled discharge rate. For example, as discussed herein, the energy capacity of the backup battery unit corresponding to the design discharge rate can be estimated by multiplying the amount of energy discharged at the first controlled discharge rate by a suitable factor based on data indicative of differences between the amount of energy that can be discharged from the backup battery unit at the design discharge rate and the first controlled discharge rate.

In act 112, the capacity gage is updated to reflect the estimate of the amount of energy that can be discharged from the backup battery unit at the design discharge rate. As discussed herein, the capacity gage can be updated at a suitable time after the backup battery unit has been charged back to the predetermined high charge level to reflect the estimate of the amount of energy that can be discharged from the backup battery unit at the design discharge rate.

In the method 100, any suitable controlled discharge rate can be used. For example, in some embodiments, the controlled discharge rate is less than 50% of the design discharge rate.

In the method 100, the power system controller can base the estimate of the first amount of energy on any suitable additional parameter. For example, in some embodiments, the power system controller estimates the first amount of energy further based on an age of the backup battery unit and/or a temperature of the backup battery unit.

In some embodiments of the method 100, the energy discharged by the backup battery unit is supplied to a regular system load. For example, the method 100 can include controlling the power supply unit, via the power system controller, to generate a varying direct current (DC) power from a combination of the energy discharged from the backup battery unit and a varying power supplied to the power supply unit. The varying DC current power can be supplied to the regular system load.

In many embodiments of the method 100, the discharge of the backup battery unit is terminated so as to prevent an under-voltage condition. For example, in many embodiments, the discharge of energy from the backup battery unit at the controlled discharge rate is terminated when an output voltage of the backup battery unit drops to a predetermined minimum output voltage.

The method 100 can discharge the backup battery at any suitable controlled discharge rate. For example, the method can include discharging a third amount of energy from the backup battery unit at a third controlled discharge rate from the predetermined high charge level to a third lower charge level (e.g., an empty charge level of the backup battery unit for the third controlled discharge rate). In some embodiments, the third controlled discharge rate is less than 75% of the first controlled discharge rate. The power system controller can store data by which the power system controller estimates the amount of energy that can be discharged from the backup battery unit at the design discharge rate based on the third amount of energy discharged from the backup battery unit at the third controlled discharge rate and the third controlled discharge rate. For example, when the load 26 is insufficient in magnitude to draw power at the first controlled discharge rate, the ability to use a lower controlled discharge rate enables the power system controller to estimate the amount of energy that can be discharged at the design discharge rate based on the amount of energy discharged at the lower third controlled discharge rate and the lower third controlled discharge rate.

Figure 6:
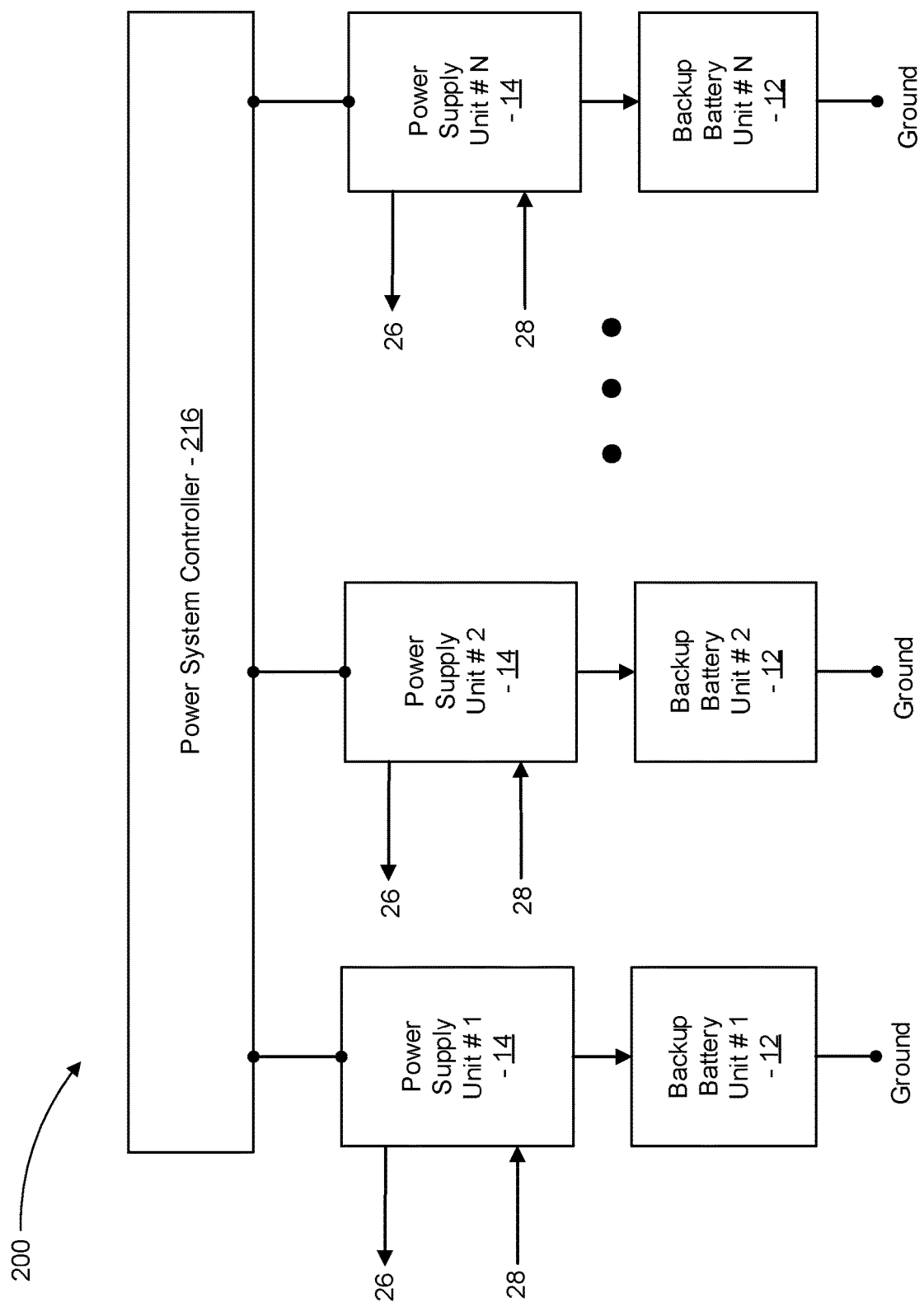
FIG. 6 is a simplified schematic diagram of a power supply system including a power system controller and backup battery units, each of the backup battery units including a battery management unit with a capacity gage, in accordance with some embodiments.

FIG. 6 is a simplified schematic diagram of a power supply system 200, in accordance with some embodiments. The power supply system 200 is similar to the power supply system 10, but includes multiple pairs of a respective power supply unit 14 and a respective backup battery unit 12. Any suitable number of pairs of the power supply unit 14 and the backup battery unit 12 can be included in the power supply system 200.

In some embodiments, the power supply system 200 is configured to be mounted in a shelf of a server rack and operatively coupled with DC bus bars of the server rack to supply DC power to system loads mounted in the server rack. The power supply system 200 includes a power system controller 216 that is configured similar to the power shelf controller 16 of the power supply system 10 with the power system controller 216 being configured to control each of the power supply units 14 included in the power supply system 200. The power system controller 216 is communicatively coupled with each of the power supply units 14 to conduct the discharge cycle at the first controlled discharge rate and to estimate capacity of each respective backup battery unit 12 when discharged at the design controlled discharge rate as described herein.

In the illustrated embodiment, each of the power supply units 14 is connected to the load 26 (e.g., via DC bus bars of the server rack) and the power source 28. During normal operation, the power source 28 supplies electrical power to each of the power supply units 14 and each of the power supply units 14 supply electric power to the load 26.

In many embodiments, the power system controller 216 controls operation of each of the power supply units 14 to periodically calibrate the capacity gage of the respective backup battery unit 12 as described herein with respect to the power supply system 10. Any suitable schedule for calibrating the capacity gages can be employed.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method of updating a capacity gage of a backup battery unit, the method comprising:
   charging the backup battery unit to a predetermined high charge level;
   controlling, by a power system controller, a power supply unit to discharge an amount of energy from the backup battery unit at a controlled discharge rate to discharge the backup battery unit from the predetermined high charge level to a low charge level at which a battery management unit of the backup battery unit terminates discharge of energy from the backup battery unit in response to an output voltage of the backup battery unit dropping to a predetermined minimum output voltage;
   simultaneously supplying, to the power supply unit,
      the amount of energy discharged from the backup battery unit at the controlled discharge rate, and
      a varying input electrical power supplied by a utility power source;
   controlling, by the power system controller, the power supply unit to supply a varying output electrical power to a load, wherein the varying output electrical power supplied to the load is generated by the power supply unit from a combination of the amount of energy discharged from the backup battery unit at the controlled discharge rate and the varying input electrical power supplied to the power supply unit by the utility power source;
   charging the backup battery unit back to the predetermined high charge level;
   estimating, by the power system controller, a design discharge rate energy capacity of the backup battery unit, wherein the design discharge rate energy capacity is an amount of energy that can be discharged from the backup battery unit, when charged to the predetermined high charge level, at a design discharge rate, wherein power system controller estimates the design discharge rate energy capacity of the backup battery unit based on the controlled discharge rate and the amount of energy discharged from the backup battery unit at the controlled discharge rate, and wherein the design discharge rate is greater than the first controlled discharge rate; and
   updating the capacity gage based on the second amount of energy the design discharge rate energy capacity of the backup battery unit estimated by the control unit the power system controller.

2. The method of claim 1, wherein the controlled discharge rate is less than 50% of the design discharge rate.

3. The method of claim 1, wherein the backup battery unit comprises the power system controller.

4. The method of claim 1, wherein the power system controller estimates the design discharge rate energy capacity further based on a temperature of the backup battery unit.

5. A power system controller comprising:
   one or more processors; and
   a tangible memory device storing non-transitory instructions executable by the one or more processors to cause the one or more processors to:
   cause a backup battery unit to be charged to a predetermined high charge level;
   control a power supply unit to discharge a first amount of energy from the backup battery unit at a first controlled discharge rate to discharge the backup battery unit from the predetermined high charge level to a first low charge level;
   control the power supply unit to output a varying electrical power to a load, the varying electrical power output to the load being generated by the power supply unit from a combination of the first amount of energy discharged from the backup battery unit at the first controlled discharge rate and a varying input power supplied to the power supply unit by a utility power source;
   cause the backup battery unit to be charged back to the predetermined high charge level;
   estimate, based on the first controlled discharge rate and the first amount of energy discharged from the backup battery unit at the first controlled discharge rate, a design discharge rate energy capacity of the backup battery unit, wherein the design discharge rate energy capacity of the backup battery unit is an amount of energy that can be discharged from the backup battery unit at a design discharge rate, and wherein the design discharge rate is greater than the first controlled discharge rate; and
   update a capacity gage of the backup battery unit based on the estimated design discharge rate energy capacity of the backup battery unit.

6. The power system controller of claim 5, wherein
the first controlled discharge rate is less than 50% of the design discharge rate.

7. The power system controller of claim 5, wherein the backup battery unit comprises the power system controller.

8. The power system controller of claim 5, wherein the instructions further cause the one or more processors to estimate the design discharge rate energy capacity of the backup battery unit further based on a temperature of the backup battery unit.

9. The power system controller of claim 5, wherein
the backup battery unit comprises a battery management unit that terminates discharge of energy from the backup battery unit at the first controlled discharge rate when an output voltage of the backup battery unit drops to a predetermined minimum output voltage.

10. The power system controller of claim 5, wherein the instructions further cause the one or more processors to:
cause the backup battery unit to be charged to the predetermined high charge level;
cause the power supply unit to discharge a second amount of energy from the backup battery unit at a second controlled discharge rate less than the first controlled discharge rate;
cause the backup battery unit to be charged back to the predetermined high charge level; and
estimate the design discharge rate energy capacity of the backup battery unit based on the second controlled discharge rate and the second amount of energy discharged from the backup battery unit at the second controlled discharge rate.

11. The power system controller of claim 10, wherein the second controlled discharge rate is less than 75% of the design discharge rate.

12. The power system controller of claim 10, wherein the instructions further cause the one or more processors to terminate discharge of energy from the backup battery unit at the second controlled discharge rate when an output voltage of the backup battery unit drops to a predetermined minimum output voltage.

13. The power system controller of claim 10, wherein the instructions further cause the one or more processors to estimate the design discharge rate energy capacity of the backup battery unit based on the second amount of energy discharged from the backup battery unit, the second controlled discharge rate, and a temperature of the backup battery unit.

14. A method of updating a capacity gage of a backup battery unit, the method comprising:
charging the backup battery unit to a predetermined high charge level;
discharging a first amount of energy from the backup battery unit at a first controlled discharge rate so as to discharge the backup battery unit from the predetermined high charge level to a first low charge level;
controlling, by a power system controller, a power supply unit to output a varying electrical power to a load, the varying electrical power output to the load being generated by the power supply unit from a combination of the first amount of energy discharged from the backup battery unit at the first controlled discharge rate and a varying input power supplied to the power supply unit by a utility power source;
charging the backup battery unit back to the predetermined high charge level;
estimating, by the power system controller, a design discharge rate energy capacity of the backup battery unit, wherein the design discharge rate energy capacity is an amount of energy that can be discharged from the backup battery unit, when charged to the predetermined high charge level, at a design discharge rate, wherein the design discharge rate energy capacity is estimated based on the first controlled discharge rate and the first amount of energy discharged from the backup battery unit at the first controlled discharge rate, and wherein the design discharge rate is greater than the first controlled discharge rate; and
updating the capacity gage based on the design discharge rate energy capacity of the backup battery unit estimated by the power system controller.

15. The method of claim 14, wherein
the first controlled discharge rate is less than 50% of the design discharge rate.

16. The method of claim 14, wherein the power system controller estimates the design discharge rate energy capacity of the backup battery unit further based on an age of the backup battery unit.

17. The method of claim 14, wherein the power system controller estimates the design discharge rate energy capacity of the backup battery unit further based on a temperature of the backup battery unit.

18. The method of claim 14, wherein
the discharge of the amount of energy from the backup battery unit at the first controlled discharge rate is terminated when an output voltage of the backup battery unit drops to a predetermined minimum output voltage.

19. The method of claim 14, further comprising:
charging the backup battery unit to the predetermined high charge level;
discharging a second amount of energy from the backup battery unit at a second controlled discharge rate to discharge the backup battery unit from the predetermined high charge level to a second low charge level, wherein the second controlled discharge rate is less than 75% of the design discharge rate;
charging the backup battery unit back to the predetermined high charge level;
estimating, by the power system controller, the design discharge rate energy capacity of the backup battery unit based on the second controlled discharge rate and the amount of energy discharged from the battery backup unit at the second controlled discharge rate; and
updating the capacity gage based on the second amount of energy the design discharge rate energy capacity of the backup battery unit estimated by the power system controller based on the second controlled discharge rate and the second amount of energy discharged from the backup battery unit at the second controlled discharge rate.

* * * * *

UNITED STATES PATENT AND TRADEMARK OFFICE
CERTIFICATE OF CORRECTION

| | | |
|---|---|---|
| PATENT NO. | : 10,770,911 B1 | Page 1 of 1 |
| APPLICATION NO. | : 15/810582 | |
| DATED | : September 8, 2020 | |
| INVENTOR(S) | : Darin Lee Frink and Ligong Wang | |

It is certified that error appears in the above-identified patent and that said Letters Patent is hereby corrected as shown below:

In the Claims

Column 10, Line 18, Claim 1:
Delete: "rate is greater than the first controlled discharge rate;"
Insert: --rate is greater than the controlled discharge rate;--

Column 10, Lines 20-23, Claim 1:
Delete: "updating the capacity gage based on the second amount of energy the design discharge rate energy capacity of the backup battery unit estimated by the control unit the power system controller"
Insert: --updating the capacity gage based on the design discharge rate energy capacity of the backup battery unit estimated by the power system controller--

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*